(12) United States Patent
Yi

(10) Patent No.: US 8,054,102 B2
(45) Date of Patent: Nov. 8, 2011

(54) INTERFACE DEVICE AND INTERFACE SYSTEM

(75) Inventor: Ju-Hwan Yi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/662,246

(22) Filed: Apr. 7, 2010

(65) Prior Publication Data
US 2010/0327910 A1    Dec. 30, 2010

(30) Foreign Application Priority Data
Jun. 26, 2009 (KR) .................. 10-2009-0057342

(51) Int. Cl.
*H03K 19/094* (2006.01)
(52) U.S. Cl. .............................. 326/86; 326/83; 327/108
(58) Field of Classification Search .................. None
See application file for complete search history.

(56) References Cited

U.S. PATENT DOCUMENTS

| | | | |
|---|---|---|---|
| 6,670,830 B2 | 12/2003 | Otsuka et al. | |
| 2002/0170011 A1* | 11/2002 | Lai et al. | 714/727 |
| 2004/0258166 A1* | 12/2004 | Camara et al. | 375/257 |
| 2005/0281343 A1* | 12/2005 | Hsu et al. | 375/257 |
| 2007/0297520 A1* | 12/2007 | Ho et al. | 375/254 |
| 2008/0037617 A1* | 2/2008 | Tang et al. | 375/220 |

FOREIGN PATENT DOCUMENTS

| | | |
|---|---|---|
| JP | 62-140566 | 6/1987 |
| KR | 10-2006-0049853 | 5/2006 |

* cited by examiner

*Primary Examiner* — Shawki Ismail
*Assistant Examiner* — Jany Tran
(74) *Attorney, Agent, or Firm* — Harness, Dickey & Pierce, P.L.C.

(57) ABSTRACT

An interface device includes a differential signal transmitter, a differential signal receiver, a first coupling capacitor, a second coupling capacitor, a direct current (DC) signal transmitter, and a DC signal receiver. The differential signal transmitter transmits a differential signal to the differential signal receiver via a differential signal line including a first signal line and a second signal line. The first coupling capacitor is communicatively coupled to the first signal line and to the differential signal transmitter. The second coupling capacitor is communicatively coupled to the first signal line and to the differential signal receiver. The DC signal transmitter transmits a DC signal via the first signal line. The DC signal receiver receives the DC signal via the first signal line.

19 Claims, 4 Drawing Sheets

INTERFACE DEVICE AND INTERFACE SYSTEM

CROSS-REFERENCE TO RELATED APPLICATIONS

This application claims priority under 35 USC §119 to Korean Patent Application No. 2009-0057342, filed on Jun. 26, 2009, in the Korean Intellectual Property Office (KIPO), the contents of which are incorporated herein in its entirety by reference.

BACKGROUND

1. Field

Example embodiments relate to an interface device, and more particularly to an interface device that transmits a direct current signal via a differential signal line, and an interface system.

2. Description of the Related Art

A high-speed interface between integrated circuits or systems has been developed to improve data processing speed. Differential signaling is widely used as the high-speed interface. A conventional interface device includes a transmitter, a receiver, and a signal line between the transmitter and the receiver. The transmitter transmits a signal to the receiver via the signal line. The conventional interface device may require an additional signal line to transmit a signal in a reverse direction.

SUMMARY

Example embodiments provide an interface device that transmits a direct current signal via a differential signal line.

Example embodiments provide an interface system that transmits a direct current signal via a differential signal line.

According to example embodiments, an interface device includes a differential signal transmitter, a differential signal receiver, a first coupling capacitor, a second coupling capacitor, a first direct current (DC) signal transmitter, and a first DC signal receiver. The differential signal transmitter transmits a differential signal via a differential signal line including a first signal line and a second signal line. The differential signal receiver receives the differential signal via the differential signal line. The first coupling capacitor includes a first electrode coupled to the first signal line and a second electrode coupled to the differential signal transmitter.

The second coupling capacitor includes a third electrode coupled to the first signal line and a fourth electrode coupled to the differential signal receiver. The first DC signal transmitter is coupled to the third electrode of the second coupling capacitor, and transmits a first DC signal via the first signal line, the first DC signal transmitter being communicatively de-coupled from the differential signal receiver. The first DC signal receiver is coupled to the first electrode of the first coupling capacitor, and receives the first DC signal via the first signal line.

According to example embodiments, the differential signal may be an alternating current (AC) signal. The first coupling capacitor may prevent the first DC signal on the first signal line from being transmitted to the differential signal transmitter, and the second coupling capacitor may prevent the first DC signal on the first signal line from being transmitted to the differential signal receiver.

According to example embodiments, the first coupling capacitor may be formed inside an integrated circuit including the differential signal transmitter. The first coupling capacitor formed outside may be an integrated circuit including the differential signal transmitter. The interface device may further include a third coupling capacitor including a fifth electrode coupled to the second signal line and a sixth electrode coupled to the differential signal transmitter, and a fourth coupling capacitor including a seventh electrode coupled to the second signal line and an eighth electrode coupled to the differential signal receiver.

According to example embodiments, the interface device may further include a second DC signal transmitter coupled to the seventh electrode of the fourth coupling capacitor, and configured to transmit a second DC signal via the second signal line, and a second DC signal receiver coupled to the fifth electrode of the third coupling capacitor, and configured to receive the second DC signal via the second signal line.

According to example embodiments, the interface device may further include a second DC signal transmitter coupled to the fifth electrode of the third coupling capacitor, and configured to transmit a second DC signal via the second signal line, and a second DC signal receiver coupled to the seventh electrode of the fourth coupling capacitor, and configured to receive the second DC signal via the second signal line.

According to example embodiments, the interface device may further include a first DC signal transceiver coupled to the seventh electrode of the fourth coupling capacitor, and configured to transmit and receive a second DC signal via the second signal line, and a second DC signal transceiver coupled to the fifth electrode of the third coupling capacitor, and configured to transmit and receive the second DC signal via the second signal line.

According to example embodiments, an interface device includes a differential signal transmitter, a differential signal receiver, a first coupling capacitor, a second coupling capacitor, a first direct current (DC) signal transceiver, and a second DC signal transceiver. The differential signal transmitter transmits a differential signal via a differential signal line including a first signal line and a second signal line. The differential signal receiver receives the differential signal via the differential signal line. The first coupling capacitor includes a first electrode coupled to the first signal line and a second electrode coupled to the differential signal transmitter. The second coupling capacitor includes a third electrode coupled to the first signal line and a fourth electrode coupled to the differential signal receiver. The first DC signal transceiver is coupled to the third electrode of the second coupling capacitor, and transmits and receives a first DC signal via the first signal line. The second DC signal transceiver is coupled to the first electrode of the first coupling capacitor, and transmits and receives the first DC signal via the first signal line.

According to example embodiments, the differential signal may be an alternating current (AC) signal.

According to example embodiments, the interface device may further include a third coupling capacitor including a fifth electrode coupled to the second signal line and a sixth electrode coupled to the differential signal transmitter, and a fourth coupling capacitor including a seventh electrode coupled to the second signal line and an eighth electrode coupled to the differential signal receiver.

According to example embodiments, the interface device may further include a DC signal transmitter coupled to the seventh electrode of the fourth coupling capacitor, and configured to transmit a second DC signal via the second signal line, and a DC signal receiver coupled to the fifth electrode of the third coupling capacitor, and configured to receive the second DC signal via the second signal line.

According to example embodiment, the interface device may further include a DC signal transmitter coupled to the fifth electrode of the third coupling capacitor, and configured to transmit a second DC signal via the second signal line, and a DC signal receiver coupled to the seventh electrode of the fourth coupling capacitor, and configured to receive the second DC signal via the second signal line.

According to example embodiment, the interface device may further include a third DC signal transceiver coupled to the seventh electrode of the fourth coupling capacitor, and configured to transmit and receive a second DC signal via the second signal line, and a fourth DC signal transceiver coupled to the fifth electrode of the third coupling capacitor, and configured to transmit and receive the second DC signal via the second signal line.

According to example embodiments, an interface system includes a transmission integrated circuit, and a reception integrated circuit. The transmission integrated circuit includes a differential signal transmitter configured to transmit a differential signal via a differential signal line including a first signal line and a second signal line, a first coupling capacitor including a first electrode coupled to the first signal line and a second electrode coupled to the differential signal transmitter, and a first DC signal receiver coupled to the first electrode of the first coupling capacitor, and configured to receive a first DC signal via the first signal line. The reception integrated circuit includes a differential signal receiver configured to receive the differential signal via the differential signal line, a second coupling capacitor including a third electrode coupled to the first signal line and a fourth electrode coupled to the differential signal receiver, and a first direct current (DC) signal transmitter coupled to the third electrode of the second coupling capacitor, and configured to transmit the first DC signal via the first signal line.

According to example embodiments, the transmission integrated circuit may further include a third coupling capacitor including a fifth electrode coupled to the second signal line and a sixth electrode coupled to the differential signal transmitter, and the reception integrated circuit may further include a fourth coupling capacitor including a seventh electrode coupled to the second signal line and an eighth electrode coupled to the differential signal receiver.

According to example embodiment, the transmission integrated circuit may further include a second DC signal receiver coupled to the fifth electrode of the third coupling capacitor, and configured to receive a second DC signal via the second signal line, and the reception integrated circuit may further include a second DC signal transmitter coupled to the seventh electrode of the fourth coupling capacitor, and configured to transmit the second DC signal via the second signal line.

According to example embodiment, the transmission integrated circuit may further include a second DC signal transmitter coupled to the fifth electrode of the third coupling capacitor, and configured to transmit a second DC signal via the second signal line, and the reception integrated circuit may further include a second DC signal receiver coupled to the seventh electrode of the fourth coupling capacitor, and configured to receive the second DC signal via the second signal line.

According to example embodiment, the transmission integrated circuit may further include a second DC signal receiver coupled to the fifth electrode of the third coupling capacitor, and configured to transmit and receive a second DC signal via the second signal line, and the reception integrated circuit may further include a first DC signal transceiver coupled to the seventh electrode of the fourth coupling capacitor, and configured to transmit and receive the second DC signal via the second signal line.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
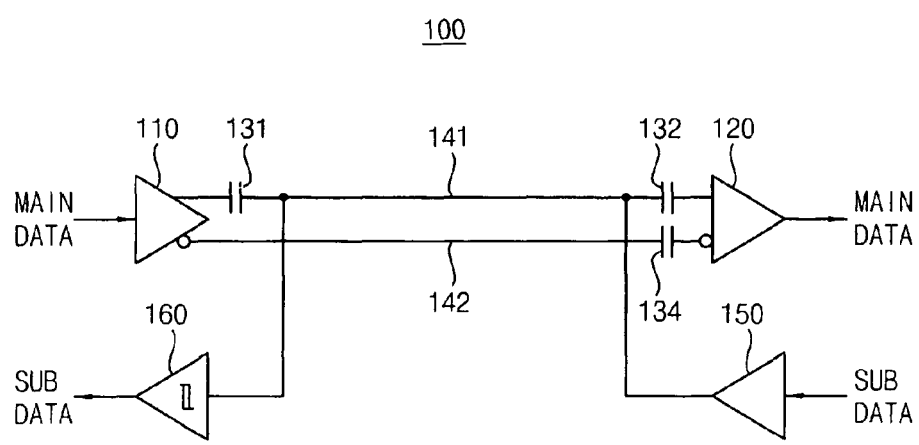
FIG. 1 is a block diagram illustrating an interface device according to example embodiments.

Various example embodiments will be described more fully hereinafter with reference to the accompanying drawings, in which example embodiments are shown. Example embodiments of the inventive concepts may, however, be embodied in many different forms and should not be construed as limited to the example embodiments set forth herein. Rather, these example embodiments are provided so that this disclosure will be thorough and complete, and will fully convey the scope of example embodiments of the inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an interface device according to example embodiments. Referring to FIG. 1, an interface device 100 includes a differential signal transmitter 110, a differential signal receiver 120, a first coupling capacitor 131, a second coupling capacitor 132, a third coupling capacitor 134, a first direct current (DC) signal transmitter 150, and a first DC signal receiver 160.

The differential signal transmitter 110 may transmit a differential signal via differential signal lines 141 and 142 including a first signal line 141 and a second signal line 142. The differential signal may be an alternating current (AC) differential signal, and may pass through the coupling capacitors 131 and 132. The differential signal may have various waveforms, such as pulse, sinusoidal, triangular, etc. According to example embodiments, the differential signal may be transmitted in high speed, and may correspond to main data, such as display data. The differential signal may be a DC-balanced signal encoded with ANSI 8B/10B encoding.

The differential signal receiver 120 may receive the differential signal via the differential signal lines 141 and 142 and from the differential signal transmitter 110. For example, the differential signal transmitter 110 and the differential signal receiver 120 may transmit and receive the differential signal via a low voltage differential signaling (LVDS) interface, a transition minimized differential signaling (TMDS) interface, a digital visual interface (DVI), a high definition multimedia interface (HMDI), a serial advanced technology attachment (SATA), etc.

The first coupling capacitor 131 may have a first electrode coupled to the first signal line 141 and a second electrode coupled to the differential signal transmitter 110. The first coupling capacitor 131 may block a DC component on the first signal line 141. For example, the first coupling capacitor 131 may prevent a DC signal on the first signal line 141 from being transmitted to the differential signal transmitter 110 by communicatively de-coupling the first DC signal receiver 160 and the first DC signal transmitter 150 from the differential signal transmitter 110.

Accordingly, the DC signal may be transmitted via the first signal line 141, and an additional signal line for the DC signal is not required. According to example embodiments, the first coupling capacitor 131 may be inside an integrated circuit including the differential signal transmitter 110. Therefore, the integrated circuit does not require an additional pin for receiving the DC signal. In example embodiments, the first coupling capacitor 131 may be outside the integrated circuit including the differential signal transmitter 110.

The second coupling capacitor 132 may have a third electrode coupled to the first signal line 141 and a fourth electrode coupled to the differential signal receiver 120. The second coupling capacitor 132 may block the DC component on the first signal line 141. For example, the second coupling capacitor 132 may prevent the DC signal on the first signal line 141 from being transmitted to the differential signal receiver 120 by communicatively de-coupling the first DC signal receiver 160 and the first DC signal transmitter 150 from the differential signal receiver 120.

Accordingly, the DC signal may be transmitted via the first signal line 141, and an additional signal line for the DC signal is not required. Further, if an integrated circuit including the differential signal transmitter 110 and an integrated circuit including the differential signal receiver 120 have different bias voltages, the differential signal between the integrated circuits may not be affected by the different bias voltages by virtue of the first coupling capacitor 131 and the second coupling capacitor 132. The second coupling capacitor 132 may be inside or outside an integrated circuit including the differential signal receiver 120.

According to example embodiments, the interface device 100 may further include a third coupling capacitor 134 having one electrode coupled to the second signal line 142 and the other electrode coupled to the differential signal receiver 120. The coupling capacitor may block a DC component of a signal on the second signal line 142.

The first DC signal transmitter 150 may be coupled to the third electrode of the second coupling capacitor 132, and transmits the DC signal via the first signal line 141 in a direction reverse to a transmission direction of the differential signal. According to example embodiments, the first DC signal transmitter 150 may be an output driver that outputs the DC signal. The DC signal may correspond to sub data, such as state information of the integrated circuit including the differential signal receiver 120. The DC signal transmitted by the first DC signal transmitter 150 may be blocked by the second coupling capacitor 132, and thus the DC signal may not affect the differential signal received by the differential signal receiver 120.

The first DC signal receiver 160 may be coupled to the first electrode of the first coupling capacitor 131, and may receive the DC signal transmitted via the first signal line 141 from the first DC signal transmitter 150. The first DC signal receiver 160 may be an input buffer that receives the sub data.

According to example embodiments, the first DC signal receiver 160 may output a logic high level signal to an internal circuit in response to the DC signal until the DC signal becomes lower than a first voltage, and may output a logic low level signal to the internal circuit in response to the DC signal until the DC signal becomes higher than a second predetermined voltage.

For example, the first DC signal receiver 160 may output the logic high level signal in response to the DC signal higher than a high voltage, and may maintain the output of the logic high level signal until the DC signal becomes lower than a low voltage although the DC signal is lower than the high voltage.

For example, the first DC signal receiver 160 may have a noise margin. The first DC signal receiver 160 may be implemented as, for example, a Schmitt trigger having the noise margin. The DC signal may be prevented from being transmitted to the differential signal transmitter 110 by the first coupling capacitor 131.

As described above, the interface device 100 according to example embodiments may transmit and receive the differential signal via the differential signal line 141 and 142. The interface device 100 may transmit and receive the DC signal via one of the differential signal line 141 and 142. Accordingly, the interface device 100 may transfer the sub data without an additional signal line and/or an additional pin.

Figure 2:
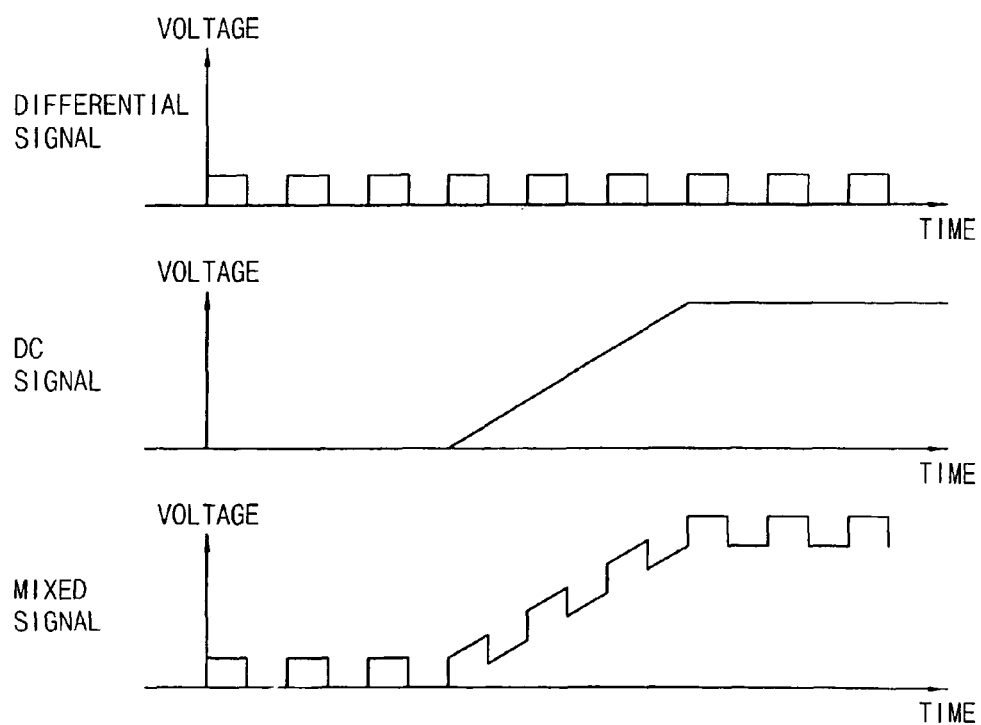
FIG. 2 is graphs illustrating signals in the interface device of FIG. 1.

FIG. 2 is graphs illustrating signals in the interface device of FIG. 1. Referring to FIGS. 1 and 2, the differential signal transmitter 110 may transmit one signal of the differential signal via the first signal line 141. The one signal may have a frequency higher than that of the DC signal, and may have a plurality of pulses.

The differential signal transmitter 110 may transmit the other signal of the differential signal via the second signal line 142. The other signal may be an inversion signal of the one signal. While the differential signal is illustrated in FIG. 2 as having the plurality of pulses, the differential signal may have various waveforms, e.g., sinusoidal, triangular, etc.

The first DC signal transmitter 150 may transmit the DC signal having a frequency lower than that of the differential signal. A voltage difference between a logic high level and a logic low level of the DC signal may be greater than that of the differential signal. Because the DC signal has a low frequency, the second coupling capacitor 132 may prevent the DC signal from being transmitted to the differential signal receiver 120, and the first coupling capacitor 131 may prevent the DC signal from being transmitted to the differential signal transmitter 110 by communicatively de-coupling the first DC signal receiver 160 and the first DC signal transmitter 150 from the differential signal transmitter 110.

A mixed signal including the differential signal and the DC signal may be transmitted at a point of the first signal line 141 between the first coupling capacitor 131 and the second coupling capacitor 132. The mixed signal may have a voltage where a voltage of the differential signal and a voltage of the DC signal are added.

Because the second coupling capacitor 132 removes the DC signal from the mixed signal, the differential signal receiver 120 may receive the differential signal as transmitted by the differential signal transmitter 110. Thus, the DC signal transmitted via the first signal line 141 may not affect the differential signal.

The first DC signal receiver 160 may receive the mixed signal. The first DC signal receiver 160 may have a noise margin to extract data corresponding to the DC signal from the mixed signal. Because the DC signal has large amplitude and the first DC signal receiver 160 has the noise margin, the first DC signal receiver 160 may accurately recover the data from the mixed signal.

Figure 3:
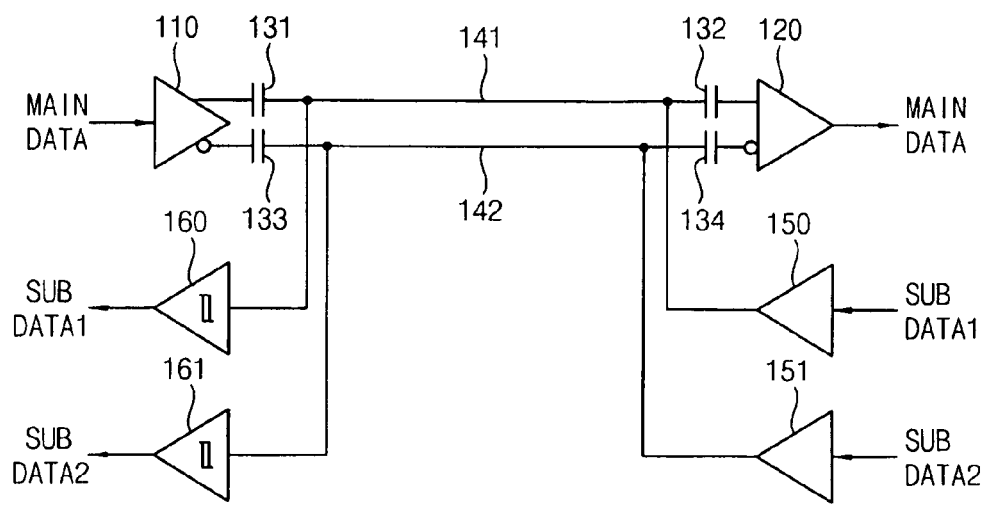
FIG. 3 is a block diagram illustrating an interface device according to example embodiments.

FIG. 3 is a block diagram illustrating an interface device according to example embodiments. Referring to FIG. 3, an interface device 200 may include a differential signal transmitter 110, a differential signal receiver 120, a first coupling capacitor 131, a second coupling capacitor 132, a third coupling capacitor 133, a fourth coupling capacitor 134, a first DC signal transmitter 150, a second DC signal transmitter 151, a first DC signal receiver 160, and a second DC signal receiver 161.

The differential signal transmitter 110 may transmit a differential signal via differential signal lines 141 and 142 including a first signal line 141 and a second signal line 142. The differential signal receiver 120 may receive the differential signal via the differential signal line 141 and 142 from the differential signal transmitter 110.

The first coupling capacitor 131 may have a first electrode coupled to the first signal line 141 and a second electrode coupled to the differential signal transmitter 110. The first coupling capacitor 131 may prevent a first DC signal on the first signal line 141 from being transmitted to the differential signal transmitter 110. The second coupling capacitor 132 may have a third electrode coupled to the first signal line 141 and a fourth electrode coupled to the differential signal receiver 120. The second coupling capacitor 132 may prevent the first DC signal on the first signal line 141 from being transmitted to the differential signal receiver 120 by communicatively de-coupling the first DC signal receiver 160 and the first DC signal transmitter 150 from the differential signal receiver 120.

The third coupling capacitor 133 may have a fifth electrode coupled to the second signal line 142 and a sixth electrode coupled to the differential signal transmitter 110. The third coupling capacitor 133 may prevent a second DC signal on the second signal line 142 from being transmitted to the differential signal transmitter 110. The fourth coupling capacitor 134 may have a seventh electrode coupled to the second signal line 142 and an eighth electrode coupled to the differential signal receiver 120. The fourth coupling capacitor 134 may prevent the second DC signal on the second signal line 142 from being transmitted to the differential signal receiver 120 by communicatively de-coupling the second DC signal receiver 161 and the second DC signal transmitter 151 from the differential signal receiver 120.

The first DC signal transmitter 150 may be coupled to the third electrode of the second coupling capacitor 132. The first DC signal transmitter 150 may transmit the first DC signal via the first signal line 141 in a direction reverse to a transmission direction of the differential signal. The first DC signal transmitted by the first DC signal transmitter 150 may be blocked by the second coupling capacitor 132, and thus the first DC signal may not affect the differential signal received by the differential signal receiver 120.

The first DC signal receiver 160 may be coupled to the first electrode of the first coupling capacitor 131. The first DC signal receiver 160 may receive the first DC signal transmitted via the first signal line 141 from the first DC signal transmitter 150. The first DC signal may be prevented from being transmitted to the differential signal transmitter 110 by the first coupling capacitor 131.

The second DC signal transmitter 151 may be coupled to the seventh electrode of the fourth coupling capacitor 134. The second DC signal transmitter 151 may transmit the second DC signal via the second signal line 142 in a direction reverse to the transmission direction of the differential signal. The second DC signal transmitted by the second DC signal transmitter 151 may be blocked by the fourth coupling capacitor 134, and thus the second DC signal does not affect the differential signal received by the differential signal receiver 120.

The second DC signal receiver 161 may be coupled to the fifth electrode of the third coupling capacitor 133. The second DC signal receiver 161 may receive the second DC signal transmitted via the second signal line 142 from the second DC signal transmitter 151. The second DC signal may be prevented from being transmitted to the differential signal transmitter 110 by the third coupling capacitor 133 by communicatively de-coupling the second DC signal receiver 161 and the second DC signal transmitter 151 from the differential signal transmitter 110.

As described above, the interface device 200, according to example embodiments, may transmit and receive the differential signal via the differential signal line 141 and 142. The interface device 200 may transmit and receive the first DC signal and the second DC signal via the differential signal line 141 and 142. Accordingly, the interface device 200 may transfer the sub data without an additional signal line and/or an additional pin.

Figure 4:
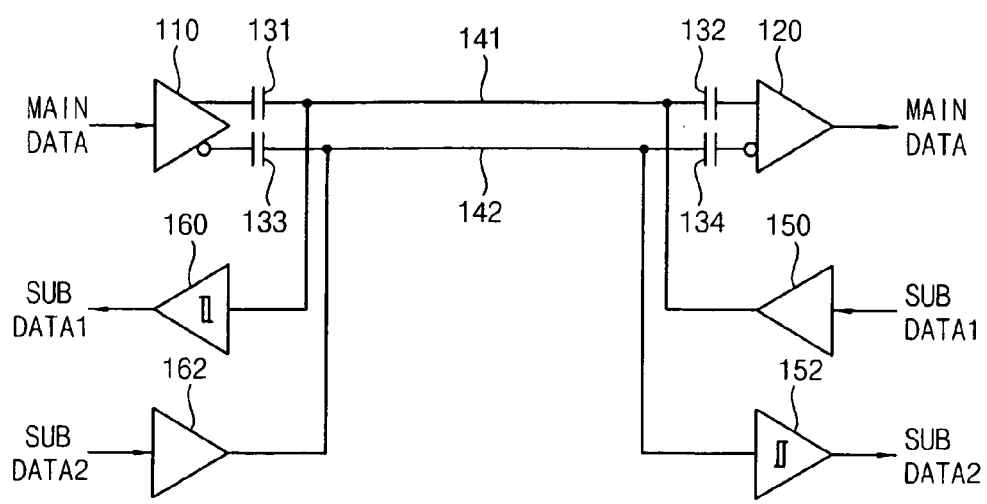
FIG. 4 is a block diagram illustrating an interface device according to example embodiments.

FIG. 4 is a block diagram illustrating an interface device according to example embodiments. Referring to FIG. 4, an interface device 300 may include a differential signal transmitter 110, a differential signal receiver 120, a first coupling capacitor 131, a second coupling capacitor 132, a third coupling capacitor 133, a fourth coupling capacitor 134, a first DC signal transmitter 150, a second DC signal transmitter 162, a first DC signal receiver 160, and a second DC signal receiver 152.

The differential signal transmitter 110 may transmit a differential signal via differential signal lines 141 and 142 including a first signal line 141 and a second signal line 142. The differential signal receiver 120 may receive the differential signal via the differential signal line 141 and 142 from the differential signal transmitter 110.

The first coupling capacitor 131 may have a first electrode coupled to the first signal line 141 and a second electrode coupled to the differential signal transmitter 110. The first coupling capacitor 131 may prevent a first DC signal on the first signal line 141 from being transmitted to the differential signal transmitter 110. The second coupling capacitor 132 may have a third electrode coupled to the first signal line 141 and a fourth electrode coupled to the differential signal receiver 120. The second coupling capacitor 132 may prevent the first DC signal on the first signal line 141 from being transmitted to the differential signal receiver 120 by communicatively de-coupling the second DC signal receiver 152 and the second DC signal transmitter 162 from the differential signal receiver 120.

The third coupling capacitor 133 may have a fifth electrode coupled to the second signal line 142 and a sixth electrode coupled to the differential signal transmitter 110. The third coupling capacitor 133 may prevent a second DC signal on the second signal line 142 from being transmitted to the differential signal transmitter 110. The fourth coupling capacitor 134 may have a seventh electrode coupled to the second signal line 142 and an eighth electrode coupled to the differential signal receiver 120. The fourth coupling capacitor 134 may prevent the second DC signal on the second signal line 142 from being transmitted to the differential signal receiver 120 by communicatively de-coupling the second DC signal receiver 152 and the second DC signal transmitter 162 from the differential signal transmitter 110.

The first DC signal transmitter 150 may be coupled to the third electrode of the second coupling capacitor 132, and may transmit the first DC signal via the first signal line 141 in a direction reverse to a transmission direction of the differential signal. The first DC signal transmitted by the first DC signal transmitter 150 may be blocked by the second coupling capacitor 132, therefore the first DC signal does not affect the differential signal received by the differential signal receiver 120.

The first DC signal receiver 160 may be coupled to the first electrode of the first coupling capacitor 131. The first DC signal receiver 160 may receive the first DC signal transmitted via the first signal line 141 from the first DC signal transmitter 150. The first DC signal is prevented from being transmitted to the differential signal transmitter 110 by the first coupling capacitor 131.

The second DC signal transmitter 162 may be coupled to the fifth electrode of the third coupling capacitor 133. The second DC signal transmitter 162 may transmit the second DC signal via the second signal line 142 in a direction the same as the transmission direction of the differential signal. The second DC signal transmitted by the second DC signal transmitter 162 may be prevented from being transmitted to the differential signal transmitter 110 by the third coupling capacitor 133.

The second DC signal receiver 152 may be coupled to the seventh electrode of the fourth coupling capacitor 134. The second DC signal receiver 152 may receive the second DC signal transmitted via the second signal line 142 from the second DC signal transmitter 162. The second DC signal may be blocked by the fourth coupling capacitor 134, thus the second DC signal does not affect the differential signal received by the differential signal receiver 120.

As described above, the interface device 300, according to example embodiments, may transmit and receive the differential signal via the differential signal line 141 and 142. The interface device 300 may transmit and receive the first DC signal and the second DC signal via the differential signal line 141 and 142. Accordingly, the interface device 300 may transfer the sub data without an additional signal line and/or an additional pin.

Figure 5:
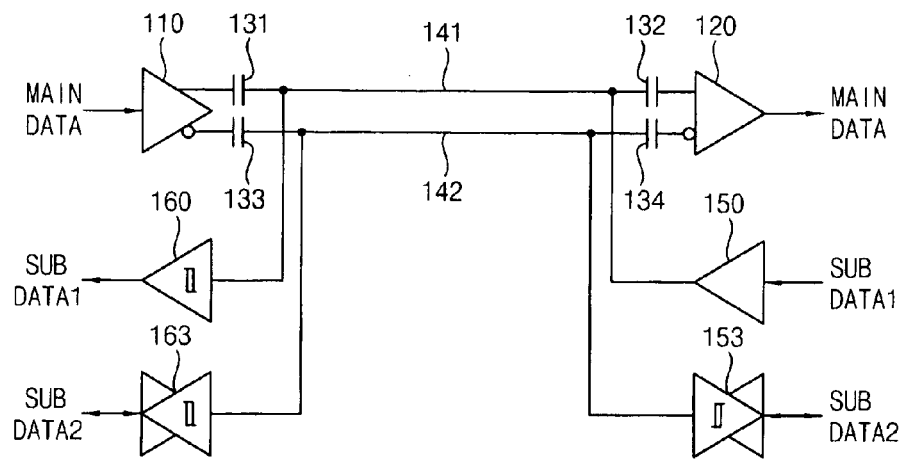
FIG. 5 is a block diagram illustrating an interface device according to example embodiments.

FIG. 5 is a block diagram illustrating an interface device according to example embodiments. Referring to FIG. 5, an interface device 400 may include a differential signal transmitter 110, a differential signal receiver 120, a first coupling capacitor 131, a second coupling capacitor 132, a third coupling capacitor 133, a fourth coupling capacitor 134, a first DC signal transmitter 150, a first DC signal receiver 160, a first DC signal transceiver 153, and a second DC signal transceiver 163.

The differential signal transmitter 110 may transmit a differential signal via a differential signal line 141 and 142 including a first signal line 141 and a second signal line 142. The differential signal receiver 120 may receive the differential signal via the differential signal line 141 and 142 from the differential signal transmitter 110.

The first coupling capacitor 131 may have a first electrode coupled to the first signal line 141 and a second electrode coupled to the differential signal transmitter 110. The first coupling capacitor 131 may prevent a first DC signal on the first signal line 141 from being transmitted to the differential signal transmitter 110. The second coupling capacitor 132 may have a third electrode coupled to the first signal line 141 and a fourth electrode coupled to the differential signal receiver 120. The second coupling capacitor 132 may prevent the first DC signal on the first signal line 141 from being transmitted to the differential signal receiver 120 by communicatively de-coupling the first DC signal receiver 160 and the first DC signal transmitter 150 from the differential signal receiver 120.

The third coupling capacitor 133 may have a fifth electrode coupled to the second signal line 142 and a sixth electrode coupled to the differential signal transmitter 110. The third coupling capacitor 133 may prevent a second DC signal on the second signal line 142 from being transmitted to the differential signal transmitter 110. The fourth coupling capacitor 134 may have a seventh electrode coupled to the second signal line 142 and an eighth electrode coupled to the differential signal receiver 120. The fourth coupling capacitor 134 may prevent the second DC signal on the second signal line 142 from being transmitted to the differential signal receiver 120 by communicatively de-coupling the first DC signal transceiver 153 and the second DC signal transceiver 163 from the differential signal transmitter 110.

The first DC signal transmitter 150 may be coupled to the third electrode of the second coupling capacitor 132. The first DC signal transmitter 150 may transmit the first DC signal via the first signal line 141 in a direction reverse to a transmission direction of the differential signal. The first DC signal transmitted by the first DC signal transmitter 150 may be blocked by the second coupling capacitor 132, thus the first DC signal may not affect the differential signal received by the differential signal receiver 120.

The first DC signal receiver 160 may be coupled to the first electrode of the first coupling capacitor 131. The first DC signal receiver 160 may receive the first DC signal transmitted via the first signal line 141 from the first DC signal transmitter 150. The first DC signal may be prevented from being transmitted to the differential signal transmitter 110 by the first coupling capacitor 131.

The first DC signal transceiver 153 may be coupled to the seventh electrode of the fourth coupling capacitor 134. The first DC signal transceiver 153 may transmit and receive the second DC signal via the second signal line 142 in a direction the same as or reverse to the transmission direction of the differential signal. The second DC signal may be blocked by the fourth coupling capacitor 134, thus the second DC signal may not affect the differential signal received by the differential signal receiver 120.

The second DC signal transceiver 163 may be coupled to the fifth electrode of the third coupling capacitor 133. The second DC signal transceiver 163 may transmit and receive the second DC signal via the second signal line 142. The second DC signal may be prevented from being transmitted to the differential signal transmitter 110 by the third coupling capacitor 133.

As described above, the interface device 400, according to example embodiments, may transmit and receive the differential signal via the differential signal lines 141 and 142. The interface device 400 may transmit and receive the first DC signal and the second DC signal via the differential signal line 141 and 142. Accordingly, the interface device 400 may transfer the sub data without an additional signal line and/or an additional pin.

Figure 6:
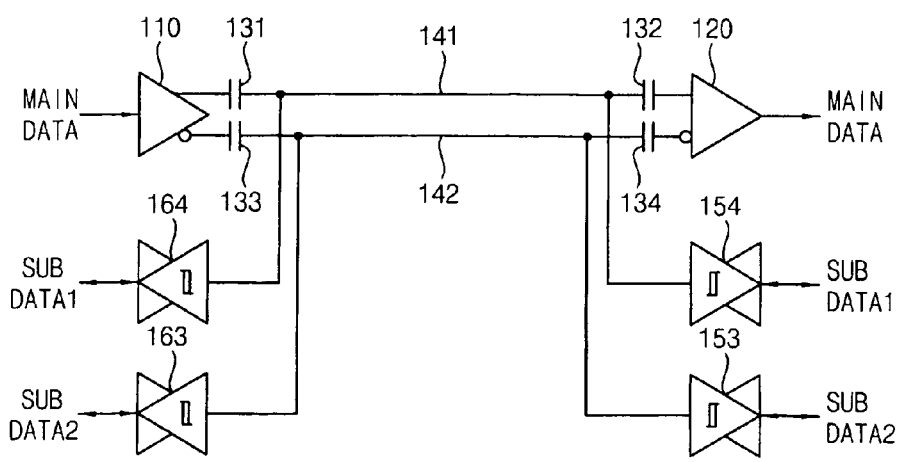
FIG. 6 is a block diagram illustrating an interface device according to example embodiments.

FIG. 6 is a block diagram illustrating an interface device according to example embodiments. Referring to FIG. 6, an interface device 500 may include a differential signal transmitter 110, a differential signal receiver 120, a first coupling capacitor 131, a second coupling capacitor 132, a third coupling capacitor 133, a fourth coupling capacitor 134, a first DC signal transceiver 154, a second DC signal transceiver 164, a third DC signal transceiver 153, and a fourth DC signal transceiver 163.

The differential signal transmitter 110 may transmit a differential signal via a differential signal line 141 and 142 including a first signal line 141 and a second signal line 142. The differential signal receiver 120 may receive the differential signal via the differential signal line 141 and 142 from the differential signal transmitter 110.

The first coupling capacitor 131 may have a first electrode coupled to the first signal line 141 and a second electrode coupled to the differential signal transmitter 110. The first coupling capacitor 131 may prevent a first DC signal on the first signal line 141 from being transmitted to the differential signal transmitter 110. The second coupling capacitor 132 may have a third electrode coupled to the first signal line 141 and a fourth electrode coupled to the differential signal receiver 120. The second coupling capacitor 132 may prevent the first DC signal on the first signal line 141 from being transmitted to the differential signal receiver 120 by communicatively de-coupling the first DC signal receiver 160 and the second DC signal transmitter 150 from the differential signal transmitter 110.

The third coupling capacitor 133 may have a fifth electrode coupled to the second signal line 142 and a sixth electrode coupled to the differential signal transmitter 110. The third coupling capacitor 133 may prevent a second DC signal on the second signal line 142 from being transmitted to the differential signal transmitter 110. The fourth coupling capacitor 134 may have a seventh electrode coupled to the second signal line 142 and an eighth electrode coupled to the differential signal receiver 120. The fourth coupling capacitor 134 may prevent the second DC signal on the second signal line 142 from being transmitted to the differential signal receiver 120 by communicatively de-coupling the first DC signal transceiver 153 and the second DC signal transceiver 163 from the differential signal transmitter 110.

The first DC signal transceiver 154 may be coupled to the third electrode of the second coupling capacitor 132. The first DC signal transceiver 154 may transmit and receive the first DC signal via the first signal line 141 in a direction the same as or reverse to a transmission direction of the differential signal. The first DC signal may be blocked by the second coupling capacitor 132, thus the second DC signal may not affect the differential signal received by the differential signal receiver 120.

The second DC signal transceiver 164 may be coupled to the first electrode of the first coupling capacitor 131. The second DC signal transceiver 164 may transmit and receive the first DC signal via the first signal line 141. The first DC signal may be prevented from being transmitted to the differential signal transmitter 110 by the first coupling capacitor 131.

The third DC signal transceiver 153 may be coupled to the seventh electrode of the fourth coupling capacitor 134. The third DC signal transceiver 153 may transmit and receive the second DC signal via the second signal line 142 in a direction the same as or reverse to the transmission direction of the differential signal. The second DC signal may be blocked by the fourth coupling capacitor 134, thus the second DC signal may not affect the differential signal received by the differential signal receiver 120.

The fourth DC signal transceiver 163 may be coupled to the fifth electrode of the third coupling capacitor 133. The fourth DC signal transceiver 163 may transmit and receive the second DC signal via the second signal line 142. The second DC signal may be prevented from being transmitted to the differential signal transmitter 110 by the third coupling capacitor 133 by communicatively de-coupling the first DC signal transceiver 153 and the second DC signal transceiver 163 from the differential signal transmitter 110.

As described above, the interface device 500, according to example embodiments, may transmit and receive the differential signal via the differential signal lines 141 and 142. The interface device 500 may transmit and receive the first DC signal and the second DC signal via the differential signal line 141 and 142. Accordingly, the interface device 500 may transfer the sub data without an additional signal line and/or an additional pin.

Figure 7:
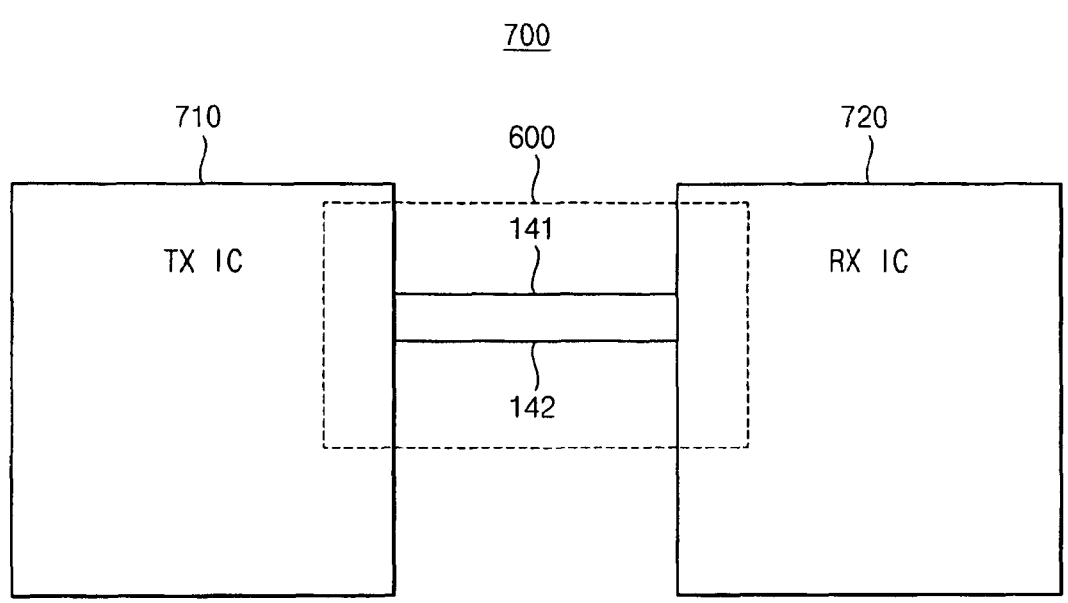
FIG. 7 is a block diagram illustrating an interface system according to example embodiments.

FIG. 7 is a block diagram illustrating an interface system according to example embodiments. Referring to FIG. 7, an interface system 700 includes a transmission integrated circuit 710 and a reception integrated circuit 720.

The transmission integrated circuit 710 may transmit a differential signal via a first signal line 141 and a second signal line 142, and the reception integrated circuit 720 may receive the differential signal via the first signal line 141 and the second signal line 142. A DC signal may be transmitted between the transmission integrated circuit 710 and the reception integrated circuit 720 via at least one of the first signal line 141 and the second signal line 142. Accordingly, the interface system 700 may transmit and receive the DC signal corresponding to sub data without an additional signal line and/or an additional pin.

The transmission integrated circuit 710 and the reception integrated circuit 720 may include an interface device 600. The interface device 600 may be the interface device 100 of FIG. 1, the interface device 200 of FIG. 3, the interface device 300 of FIG. 4, the interface device 400 of FIG. 5, or the interface device 500 of FIG. 6.

According to example embodiments, the transmission integrated circuit 710 may include, for example, a video processor, and the reception integrated circuit 720 may include, for example, a timing control device. The video processor may generate an image signal based on data received via a tuner from an antenna or data received via an input/output processor from an external device. The video processor may transmit a differential signal corresponding to the image signal via the differential signal line 141 and 142 to the timing control device. A timing controller included in the timing control device may control a display device in response to the differential signal. The timing control device may transmit a DC signal corresponding to state information of the display device via the first signal line 141 to the video processor. Accordingly, a display system including the video processor and the timing control device may transfer the sub data, e.g., the state information, without an additional signal line and/or an additional pin.

As described above, the interface device 600 and the interface system 700, according to example embodiments, may transmit a DC signal using a line for transmitting a differential signal. Accordingly, the interface device and the interface system may not require an additional signal line and/or an additional pin for transferring sub data.

The interface device and the interface system according to example embodiments may be applicable to any interface device or any interface system transmitting a differential signal, e.g., a LVDS interface system, a TMDS interface system, a DVI system, a HDMI system, a SATA interface system, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of example embodiments of the inventive concepts. Accordingly, all such modifications are intended to be included within the scope of example embodiments of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An interface device, comprising:
a differential signal transmitter configured to transmit a differential signal via a differential signal line including a first signal line and a second signal line;
a differential signal receiver configured to receive the differential signal via the differential signal line;
a first direct current (DC) signal transmitter configured to transmit a first DC signal via the first signal line, the first DC signal transmitter being communicatively de-coupled from the differential signal receiver; and
a first DC signal receiver configured to receive the first DC signal via the first signal line, the first DC signal receiver being communicatively de-coupled from the differential signal receiver.

2. The interface device of claim 1, comprising:
a first coupling capacitor including a first electrode communicatively coupled to the first signal line and a second electrode communicatively coupled to the differential signal transmitter; and
a second coupling capacitor including a third electrode communicatively coupled to the first signal line and a fourth electrode communicatively coupled to the differential signal receiver.

3. The interface device of claim 2, wherein
the first coupling capacitor communicatively de-couples the first DC signal transmitter from the differential signal transmitter, and
the second coupling capacitor communicatively de-couples the first DC signal receiver from the differential signal receiver.

4. The interface device of claim 1, wherein the first coupling capacitor is one of on an integrated circuit including the differential signal transmitter and not on an integrated circuit including the differential signal transmitter.

5. The interface device of claim 1, further comprising:
a third coupling capacitor including a fifth electrode communicatively coupled to the second signal line and a sixth electrode communicatively coupled to the differential signal transmitter; and
a fourth coupling capacitor including a seventh electrode communicatively coupled to the second signal line and an eighth electrode communicatively coupled to the differential signal receiver.

6. The interface device of claim 5, further comprising:
a second DC signal transmitter communicatively coupled to the seventh electrode of the fourth coupling capacitor, and configured to transmit a second DC signal via the second signal line; and
a second DC signal receiver communicatively coupled to the fifth electrode of the third coupling capacitor, and configured to receive the second DC signal via the second signal line.

7. The interface device of claim 5, further comprising:
a second DC signal transmitter communicatively coupled to the fifth electrode of the third coupling capacitor, and configured to transmit a second DC signal via the second signal line; and
a second DC signal receiver communicatively coupled to the seventh electrode of the fourth coupling capacitor, and configured to receive the second DC signal via the second signal line.

8. The interface device of claim 5, further comprising:
a first DC signal transceiver communicatively coupled to the seventh electrode of the fourth coupling capacitor, and configured to transmit and receive a second DC signal via the second signal line; and
a second DC signal transceiver coupled to the fifth electrode of the third coupling capacitor, and configured to transmit and receive the second DC signal via the second signal line.

9. An interface device, comprising:
a differential signal transmitter configured to transmit a differential signal via a differential signal line including a first signal line and a second signal line;
a differential signal receiver configured to receive the differential signal via the differential signal line;
a first coupling capacitor including a first electrode communicatively coupled to the first signal line and a second electrode communicatively coupled to the differential signal transmitter;
a second coupling capacitor including a third electrode communicatively coupled to the first signal line and a fourth electrode communicatively coupled to the differential signal receiver;
a first direct current (DC) signal transceiver communicatively coupled to the third electrode of the second coupling capacitor, and configured to transmit and receive a first DC signal via the first signal line; and a second DC signal transceiver communicatively coupled to the first electrode of the first coupling capacitor, and configured to transmit and receive the first DC signal via the first signal line.

10. The interface device of claim 9, wherein the differential signal is an alternating current (AC) signal.

11. The interface device of claim 9, further comprising:
a third coupling capacitor including a fifth electrode communicatively coupled to the second signal line and a sixth electrode communicatively coupled to the differential signal transmitter; and
a fourth coupling capacitor including a seventh electrode communicatively coupled to the second signal line and an eighth electrode communicatively coupled to the differential signal receiver.

12. The interface device of claim 11, further comprising:
a DC signal transmitter communicatively coupled to the seventh electrode of the fourth coupling capacitor, and configured to transmit a second DC signal via the second signal line; and
a DC signal receiver communicatively coupled to the fifth electrode of the third coupling capacitor, and configured to receive the second DC signal via the second signal line.

13. The interface device of claim 11, further comprising:
a DC signal transmitter communicatively coupled to the fifth electrode of the third coupling capacitor, and configured to transmit a second DC signal via the second signal line; and
a DC signal receiver communicatively coupled to the seventh electrode of the fourth coupling capacitor, and configured to receive the second DC signal via the second signal line.

14. The interface device of claim 11, further comprising:
a third DC signal transceiver communicatively coupled to the seventh electrode of the fourth coupling capacitor, and configured to transmit and receive a second DC signal via the second signal line; and
a fourth DC signal transceiver communicatively coupled to the fifth electrode of the third coupling capacitor, and configured to transmit and receive the second DC signal via the second signal line.

15. An interface system, comprising:
a transmission integrated circuit including,
a differential signal transmitter configured to transmit a differential signal via a differential signal line including a first signal line and a second signal line,
a first coupling capacitor including a first electrode communicatively coupled to the first signal line and a second electrode communicatively coupled to the differential signal transmitter, and
a first DC signal receiver communicatively coupled to the first electrode of the first coupling capacitor, and configured to receive a first DC signal via the first signal line; and a reception integrated circuit including,
a differential signal receiver configured to receive the differential signal via the differential signal line;
a second coupling capacitor including a third electrode communicatively coupled to the first signal line and a fourth electrode communicatively coupled to the differential signal receiver; and
a first direct current (DC) signal transmitter communicatively coupled to the third electrode of the second coupling capacitor, and configured to transmit the first DC signal via the first signal line.

16. The interface system of claim 15, wherein
the transmission integrated circuit includes a third coupling capacitor including a fifth electrode communicatively coupled to the second signal line and a sixth electrode communicatively coupled to the differential signal transmitter, and
the reception integrated circuit includes a fourth coupling capacitor including a seventh electrode communicatively coupled to the second signal line and an eighth electrode communicatively coupled to the differential signal receiver.

17. The interface system of claim 16, wherein
the transmission integrated circuit includes a second DC signal receiver communicatively coupled to the fifth electrode of the third coupling capacitor, and configured to receive a second DC signal via the second signal line, and
the reception integrated circuit includes a second DC signal transmitter communicatively coupled to the seventh electrode of the fourth coupling capacitor, and configured to transmit the second DC signal via the second signal line.

18. The interface system of claim 16, wherein
the transmission integrated circuit includes a second DC signal transmitter communicatively coupled to the fifth electrode of the third coupling capacitor, and configured to transmit a second DC signal via the second signal line, and
the reception integrated circuit includes a second DC signal receiver communicatively coupled to the seventh electrode of the fourth coupling capacitor, and configured to receive the second DC signal via the second signal line.

19. The interface system of claim 16, wherein
the transmission integrated circuit includes a second DC signal receiver communicatively coupled to the fifth electrode of the third coupling capacitor, and configured to transmit and receive a second DC signal via the second signal line, and
the reception integrated circuit includes a first DC signal transceiver communicatively coupled to the seventh electrode of the fourth coupling capacitor, and configured to transmit and receive the second DC signal via the second signal line.

\* \* \* \* \*